United States Patent [19]

Jarrett et al.

[11] 4,358,689

[45] Nov. 9, 1982

[54] ANALOG TO DIGITAL INTERFACE CIRCUIT

[75] Inventors: Robert B. Jarrett, Tempe; James J. LoCascio, Mesa, both of Ariz.

[73] Assignee: Motorola, Inc., Schaumburg, Ill.

[21] Appl. No.: 166,864

[22] Filed: Jul. 7, 1980

[51] Int. Cl.³ .................. H03K 5/08; H03K 5/153; H03K 19/092

[52] U.S. Cl. .................. 307/264; 307/360; 307/475; 307/555

[58] Field of Search .................. 307/264, 360, 362, 475, 307/540, 555, 567; 328/147; 148, 149; 357/92

[56] References Cited

U.S. PATENT DOCUMENTS

| | | | |
|---|---|---|---|
| 3,873,853 | 3/1975 | Ahmed | 307/360 |
| 3,947,699 | 3/1976 | Whitmer | 307/360 |
| 4,291,356 | 9/1981 | Mathieu | 307/360 |

Primary Examiner—John Zazworsky
Attorney, Agent, or Firm—Michael D. Bingham

[57] ABSTRACT

An interface circuit adapted to receive an analog input signal for generating first and second output signals at respective outputs in response to the input signal varying above a first reference voltage level and varying below a second reference voltage level. The interface circuit comprising first and second circuits each of which has an input coupled to the input of the interface circuit and receiving the first and second reference voltage levels respectively. Each one of the two circuits includes a voltage translation circuit for translating the reference voltage level supplied thereto and a comparator to produce the particular output signal in response to the input signal level assuming the aforementioned relationship with respect to the respective two reference voltage levels.

13 Claims, 2 Drawing Figures

ANALOG TO DIGITAL INTERFACE CIRCUIT

CROSS-REFERENCE TO A RELATED APPLICATION

The subject matter of the subject invention is related to the subject matter of an application entitled "Current Ramping Controller Circuit", Ser. No. 166,866 by Jarrett et al filed concurrently herewith which is assigned to Motorola, Inc.

BACKGROUND OF THE INVENTION

1. Field of the Invention

The present invention relates to interface circuits and more particularly to an interface circuit for providing a set and reset pulse to an Integrated Injection Logic ($I^2L$) latch circuit in response to an analog signal provided thereto.

2. Description of the Prior Art

There are many interface circuit applications requiring ramping capacitor time generators for supplying digital output signals therefrom. An example for such an application is in electronic ignition systems. In some contemporary electronic ignition systems, in response to a timing signals generated in timed relationship to the operation of the engine, there is provided a series of firing command signals for creating spark to operate the engine. The ignition systems usually require at least one and usually more than one capacitor to be ramped up and down, as understood, to generate the aforementioned firing command signals. For example, U.S. Pat. No. 4,041,912 to Charles Session, assigned to Motorola Inc., shows the need of such ramping capacitors and ramping circuits. The ramping capacitor may be clamped at upper and lower voltage levels in order to derive a delayed, well defined rectangular square wave output which is utilized to generate the foregoing firing command signals. In an electronic ignition system incorporating the embodiment of the present invention, the upper and lower capacitor voltage clamp levels are utilized to drive an $I^2L$ latch circuit for providing the aforementioned rectangular output square wave. However, $I^2L$ latches generally do not have immunity to noise induced input signals thereto.

Thus, there is a need for an interface circuit responsive to capacitor upper and lower voltage clamp levels for providing inputs to an $I^2L$ latch circuit while providing high noise immunity.

SUMMARY OF THE INVENTION

Accordingly, it is an object of the present invention to provide an interface circuit for providing set and reset commands to an $I^2L$ latch while providing high noise immunity.

It is another object of the invention to provide an interface circuit for utilization in an electronic ignition system.

In accordance with the foregoing and other objects there is provided an interface circuit for providing set and reset command signals at first and second outputs thereof which can be utilized to drive an $I^2L$ latch circuit in response to an analog signal supplied thereto. The interface circuit comprises a first circuit having first and second inputs which is responsive to an input signal applied to the first input thereof exceeding a reference signal supplied at the second input thereof for providing a first output signal that is compatible for driving an $I^2L$ latch circuit, for instance. The interface circuit further includes a second circuit having first and second inputs and an output which is responsive to the input signal supplied to the first input thereof becoming less than a second reference potential supplied to the second input thereof for providing an output signal at the output thereof which can be used to drive an input of the $I^2L$ latch circuit.

In one feature of the invention the outputs from the first and second circuits provide for setting and resetting the $I^2L$ latch circuit.

DETAILED DESCRIPTION OF THE PREFERRED EMBODIMENT

Figure 1:
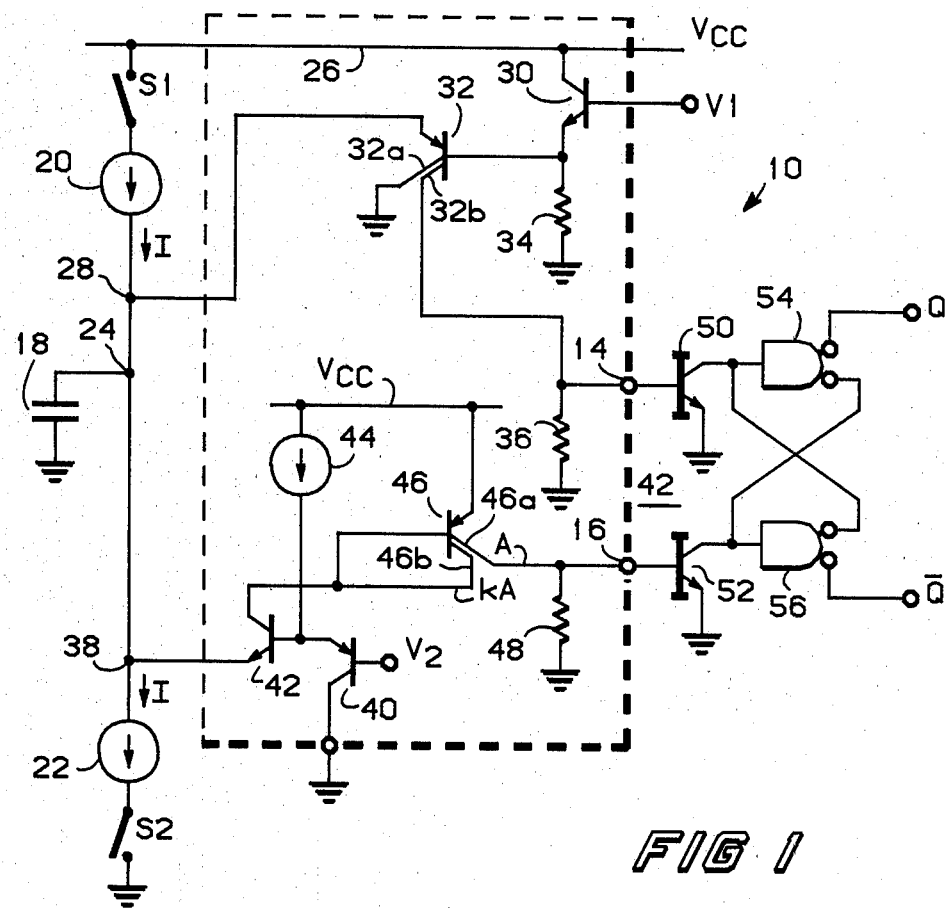
FIG. 1 is a schematic diagram of the preferred embodiment of the invention.

Turning to the figures there is shown interface circuit 10 of the present invention which provides first and second output signals at output terminals 14 and 16 respectfully that may be utilized to set and reset Integrated Injection Logic ($I^2L$) latch circuit 12. As shown, interface circuit 10 is responsive to capacitor 18 being charged and discharged between two levels to supply the foregoing set and reset signals however it is to be understood that any other analog signal of the same form could be utilized. Capacitor 18 is charged at a rate proportional to the current I supplied through current source 20 when switch S1 is closed. Alternately, capacitor 18 is discharged at a rate proportional to the current I sunk by current source 22 whenever switch S2 is closed. Capacitor 18, which may be a discrete capacitor, is connected to the current ramping controller circuit comprising current sources 20 and 22 at node 24. The current ramping controller circuit along with interface circuit 10 and $I^2L$ latch circuit 12 are suitable to be manufactured in integrated circuit form, as is understood, with interface circuit 10 being shown included within the dashed outline. The current ramping controller circuit insures that capacitor 18 is charged and discharged at the same proportional rate. Any such circuit can be utilized in the present invention with one type of current ramping controller circuit being shown by the aforereferenced Jarrett et al patent application which is incorporated herein by reference. As shown in FIG. 1, current source 20 is connected between a power supply conductor 26 which is adapted to receive a source of operating potential $V_{cc}$ and node 28 which serves as an input to interface circuit 10. A first circuit including transistors 30 and 32 is provided for providing an output signal at terminal 14 whenever the voltage level appearing across capacitor 18 becomes substantially equal to or greater than the value of the reference potential level, $V_1$, provided at the base of transistor 30. The collector of transistor 30 is connected to power supply 26 with the emitter thereof being coupled through resistor 34 to a terminal at which is supplied a ground reference potential, as understood a current source may replace resistor 34. The emitter of transistor 30 is also connected to the base of PNP transistor 32 with the emitter of the latter being connected to node 28. Transistor 32 is shown as being a multicollector transistor having collectors 32A and 32B. It should be understood that transistor 32 could be a single collector transistor wherein collector 32A would not be connected to the ground reference potential but rather as shown single collector 32B would be connected to output terminal 14. Resistor 36 is shown connected between output terminal 14 and the ground reference potential across which the output signal from the subject circuit is produced. In operation then, the reference potential level supplied at the base of transistor 30 is translated down by the base-to-emitter voltage drop of transistor 30 and then is translated up by the base-to-emitter voltage drop of transistor 32 whereby the voltage level at node 28 must become substantially equal to or greater than the reference potential level $V_1$ before transistor 32 is rendered conductive. When transistor 32 is rendered conductive the output signal is generated across resistor 36 and appears at output terminal 14.

Similarly, a second circuit is shown comprising transistors 40, 42 and 46 which produces an output signal at output terminal 16 across resistor 48 whenever the voltage level appearing across capacitor 18, at node 38, becomes substantially equal to or less than the magnitude of the reference potential level $V_2$ supplied at a second input, the base of PNP transistor 40. The collector of transistor 40 is connected to the ground reference potential with the emitter coupled both to the base of NPN transistor 42 and current source 44; current source 44 is returned to power supply conductor 26. Although not shown it is realized that a resistor could be substituted for current source 44. The emitter of transistor 42 is coupled to node 38 and serves as a first input to this circuit, the collector is coupled both to the base and collector 46B of PNP multicollector transistor 46. The emitter of transistor 46 is returned to power supply conductor 26 with the collector 46A being connected to output terminal 16. As will be explained hereafter, the collector areas of 46A and 46B are ratioed with respect to one another wherein the area of collector 46A is equal to the dimension A and the area of collector 46B being equal to a constant, k, times the area A. In the preferred embodiment, with transistor 32 being a multicollector transistor with each collector thereof having an equal area, the constant k of transistor 46 would be equal to 2.

Figure 2:
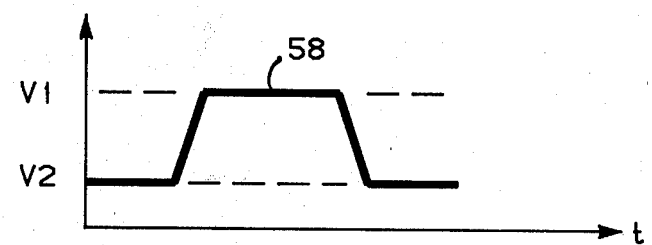
FIG. 2 is a waveform useful for explaining the operation of the invention of FIG. 1.

In operation, the reference potential level $V_2$ is first translated down and then translated up through the emitters of transistors 40 and 42 accordingly, such that transistor 42 is rendered conductive only when the magnitude of the voltage level appearing across capacitor 18 becomes less than the value of $V_2$. When transistor 42 becomes conductive, transistor 46 is rendered conductive wherein the current supplied via transistor 46 produces the output drive signal across resistor 48 at terminal 16. Thus, the voltage magnitude appearing across capacitor 18 is clamped between the reference levels $V_1$ and $V_2$ as shown by waveform 58 of FIG. 2.

A significant aspect of the foregoing described operation of the preferred embodiment of the present invention is that whenever the voltage magnitude appearing across capacitor 18 is between the two reference levels $V_1$ and $V_2$, interface circuit 10 is in a nonconductive state, i.e., the two circuits aforedescribed are biased in an off condition such that interface circuit 10 provides noise immunity between capacitor 18 and the inputs of $I^2L$ latch circuit 12.

$I^2L$ latch circuit 12 shown in logic form is generally known in the art and comprises NPN inverted transistor type devices 50 and 52 coupled with NAND gates 54 and 56. The output of NAND gate 54 provides the Q output of the latch circuit with the $\overline{Q}$ output thereof being provided at the output of NAND gate 56. Thus, the output signal generated at output terminal 14 of interface circuit 10 acts as a set signal to the latch circuit 12 forcing the Q output thereof to go high. Similarly, the high output signal generated at output 16 of interface circuit 10 corresponds to a reset signal such that the $\overline{Q}$ output of latch circuit 12 is forced high. Hence, in response to capacitor 18 being charged and discharged between voltage reference levels $V_1$ and $V_2$, a well defined rectangular pulse is generated at the outputs of latch circuit 12 which is delayed in time by a predetermined and fixed interval from the ramping and discharging of capacitor 18.

Hence, what has been described above is an analog to logic interface circuit for providing good noise immunity to the logic circuit. In response to the analog signal there is generated a well defined rectangular pulse at the output of the logic circuit which is delayed a predetermined and fixed time interval from the applied analog signal to the interface circuit.

We claim:

1. An interface circuit for providing first and second output signals in response to an applied input signal, the magnitude of which may vary above and below first and second reference voltage levels, comprising:

first circuit means having first and second inputs and an output which is responsive to the magnitude of the input signal that is supplied to said first input becoming substantially equal to the first voltage reference level that is supplied at said second input for both clamping said magnitude at the first voltage reference level to inhibit further increases in said magnitude thereof and providing the first output signal at said output;

second circuit means having first and second inputs and an output which is responsive to the magnitude of the input signal that is supplied to said first input becoming substantially equal to the second reference level that is supplied to said second input for both clamping said magnitude at the second reference level to inhibit further decrease in said magnitude thereof and providing the second output signal at said output.

2. The interface circuit of claim 1 wherein said first circuit means includes:

first voltage translation means for translating said first reference voltage level downward to a third reference voltage level; and comparator means for comparing said magnitude of the applied input signal to said third reference voltage level for producing the first output signal at said output of said first circuit means when the input signal becomes substantially equal to said third reference voltage level.

3. The interface circuit of claim 2 wherein said first voltage translation means being a first transistor of a first conductivity type having a base, emitter and collector, said base being adapted to receive said first voltage reference level, said emitter being coupled to a terminal at which is provided a ground reference potential, said collector being coupled to a power supply conductor at which is supplied a source of operating potential.

4. The interface circuit of claim 3 wherein said comparator means being a second transistor of a second conductivity type having a base, an emitter, and a first collector, said base being coupled to said emitter of said first transistor, said emitter being coupled to said first input of said first circuit means, said first collector being coupled to said output of said first circuit means.

5. The interface circuit of claim 4 wherein said second transistor includes a second collector coupled to said terminal at which is supplied said ground reference potential.

6. The interface circuit of claim 5 wherein said second circuit means includes:
second voltage translation means adapted to receive said second reference voltage level for translating the same to a fourth reference voltage level; and
comparator means for comparing the magnitude of the input signal to said fourth reference voltage level for providing the second output signal at the output of said second circuit means.

7. The interface circuit of claim 6 wherein said second voltage translation means includes a third transistor of said second conductivity type having a base, emitter, and collector, said base being said second input of said second circuit means, said collector being coupled to said terminal at which is supplied said ground reference potential and said emitter being coupled to a current source.

8. The interface circuit of claim 7 wherein said comparator means of said second circuit means includes a fourth transistor of said first conductivity type having a base, an emitter and collector, said emitter being coupled to said first input of said second circuit means, said base being coupled to said emitter of said third transistor, and said collector being coupled to said output of said second circuit means.

9. The interface circuit of claim 8 wherein said comparator means of said second circuit means further includes a fifth transistor of said second conductivity type having an emitter, a base, a first collector, and a second collector, said emitter being coupled to said power supply, said base being coupled with said first collector to said collector of said fourth transistor, said second collector being coupled to said output of said second circuit means, said first and second collectors being area ratioed with respect to each other with said first collector having a greater area in relation to said second collector.

10. The interface circuit of claim 1 wherein said second circuit means includes:
voltage translation means adapted to receive said second reference voltage level for translating the same upward to a third reference voltage level; and
comparator means for comparing the magnitude of the input signal to said third reference voltage level for providing the second output signal at the output of said second circuit means.

11. The interface circuit of claim 10 wherein said voltage translation means includes a first transistor of first conductivity type having a base, emitter, and collector, said base being said second input of said second circuit means, said collector being coupled to a terminal at which is supplied a ground reference potential, and said emitter being coupled to a current source.

12. The interface circuit of claim 11 wherein said comparator means includes a second transistor of a second conductivity type having a base, an emitter and collector, said emitter being coupled to said first input of said second circuit means, said base being coupled to said emitter of said first transistor, and said collector being coupled to said output of said second circuit means.

13. The interface circuit of claim 12 wherein said comparator means further includes a third transistor of said first conductivity type having an emitter, a base, a first collector, and a second collector, said emitter being coupled to a power supply, said base being coupled with said first collector to said collector of said second transistor, said second collector being coupled to said output of said second circuit means, said first and second collectors being area ratioed with respect to each other with said first collector having a greater area in relation to said second collector.

* * * * *